(12) United States Patent
Denham

(10) Patent No.: US 8,803,555 B2
(45) Date of Patent: Aug. 12, 2014

(54) APPARATUS AND METHOD FOR DECODING AN ADDRESS IN TWO STAGES

(75) Inventor: Martin S. Denham, Bend, OR (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/461,322

(22) Filed: May 1, 2012

(65) Prior Publication Data

US 2013/0027084 A1 Jan. 31, 2013

Related U.S. Application Data

(60) Provisional application No. 61/481,929, filed on May 3, 2011.

(51) Int. Cl.
*G11C 8/10* (2006.01)
*G11C 8/08* (2006.01)

(52) U.S. Cl.
CPC ...... *G11C 8/10* (2013.01); *G11C 8/08* (2013.01)
USPC .................. 326/105; 326/106; 365/230.06

(58) Field of Classification Search
USPC ............................................. 326/105
See application file for complete search history.

(56) References Cited

U.S. PATENT DOCUMENTS

| | | | | |
|---|---|---|---|---|
| 3,855,580 A | * | 12/1974 | Lighthall et al. | 365/233.14 |
| 5,719,819 A | * | 2/1998 | Maeno | 365/230.06 |
| 6,198,686 B1 | * | 3/2001 | Takita et al. | 365/230.06 |
| 7,298,665 B2 | * | 11/2007 | So et al. | 365/230.06 |
| 7,768,316 B2 | * | 8/2010 | Toriumi et al. | 326/105 |
| 7,821,299 B2 | * | 10/2010 | Liu | 326/105 |
| 7,869,256 B2 | * | 1/2011 | Park et al. | 365/148 |

OTHER PUBLICATIONS

Mano, Morris, Digital Logic and Computer Design, Prentice-Hall, 1979.*

* cited by examiner

*Primary Examiner* — Alexander H Taningco
*Assistant Examiner* — Nelson Correa
(74) *Attorney, Agent, or Firm* — Lando & Anastasi, LLP

(57) ABSTRACT

Methods and apparatus for decoding of binary addresses and scanning rows and columns of an addressable array. In one example, an address decode circuit includes a first decoder circuit configured to partition an N-bit address into a plurality of address segments, each address segment including fewer than N bits, and N being a positive integer, the first decoder circuit configured to provide a plurality of first-stage decoded address outputs, and a second orthogonal decoder circuit coupled to the first decoder circuit and configured to receive the first-stage decoded address outputs and to produce $2^N$ unique addresses from unique combinations of the plurality of first-stage decoded address outputs.

14 Claims, 4 Drawing Sheets

APPARATUS AND METHOD FOR DECODING AN ADDRESS IN TWO STAGES

CROSS REFERENCE TO RELATED APPLICATIONS

This application claims priority under 35 U.S.C. §119(e) to U.S. Provisional Patent Application No. 61/481,929 filed May 3, 2011 and titled "APPARATUS AND METHOD FOR DECODING AN ADDRESS IN TWO STAGES," which is incorporated herein by reference in its entirety.

FEDERALLY SPONSORED RESEARCH

This invention was made with government support under Contract No. HR0011-08-C-0115 awarded by the Department of Defense. The U.S. government has certain rights in this invention.

BACKGROUND

In a typical read-out integrated circuit (ROIC), a rectangular focal plane array (FPA) contains pixels arranged in rows and columns. Periodically, during each frame period, a video stream comprising the sequential contents of the pixels is transferred to an output. This video stream may include a sequence of coulombic charges, voltages, or digital values (if a mechanism by which to convert the pixel contents to digital values resides on the ROIC). Rows of the FPA may be read one at a time to column circuits, there being one column circuit per column of the array. Subsequently, each individual pixel of the column circuit is transferred sequentially to the output. In some examples, the original address space is projected across all rows and columns of the array and decoded using AND gates. Each unique address of a pixel in the array is directly decoded from all bits of the address space.

SUMMARY OF THE INVENTION

Aspects and embodiments relate generally to electronic circuit design and more specifically to the decoding of binary addresses and to scanning rows and columns of an array of pixels. In particular, various aspects are directed to a method of decoding addresses that offers significant power reduction and superior addressing flexibility. Embodiments include a two-stage address decoding technique in which the first stage creates "one-hot" lines for address segments. Orthogonal combination of these lines in the second stage creates unique addressing with less power consumption than conventional techniques.

According to one embodiment, an address decode circuit comprises an N-bit address, logically partitioned into a plurality of address segments, each address segment some number of the N bits, and N being a positive integer, coupled to a first decoder circuit configured to provide a plurality of first-stage decoded address outputs, and a second orthogonal decoder circuit coupled to the first decoder circuit and configured to receive the first-stage decoded address outputs and to produce $2^N$ unique addresses from unique combinations of the plurality of first-stage decoded address outputs.

In one example the first decoder circuit includes a plurality of decoders, each decoder configured to receive and decode one of the plurality of address segments. The first decoder circuit may further include a plurality of output lines coupled to the plurality of decoders, the plurality of first-stage decoded address outputs being provided on the plurality of output lines. In one example the decoders are one-hot decoders. The second orthogonal decoder circuit may include at least one AND gate or NAND gate configured to orthogonally recombine the unique combinations of the plurality of first-stage decoded address outputs to produce the $2^N$ unique addresses. It will also be appreciated that other types of logic gates, such as OR or NOR gates may be used instead of or in combination with the AND or NAND gates. It will also be appreciated that the first stage decoded address outputs may be active low. In one example each address segment includes the same number of address bits. The address decode circuit may further comprise conditioning logic coupled to the first decoder circuit. In one example the conditioning logic includes a timing signal.

Another embodiment is directed to a method of decoding an N-bit binary address, N being a positive integer, and the method comprising partitioning the N-bit address into a plurality of address segments, decoding the plurality of address segments to provide a plurality of first-stage decodes, and exhaustively combining the plurality of first-stage decodes to produce $2^N$ unique addresses. In another example, the exhaustive address space of $2^N$ may be selectively depopulated for particular applications or circumstances, such as in the example of an addressable circuit that does not fully expand to fill a $2^N$ address space.

In one example of the method, decoding the plurality of address segments includes one-hot decoding the plurality of address segments. In another example the method further comprises coupling a timing signal into at least one of the plurality of address segments.

According to another embodiment an address decode circuit is configured to decode an address of N address bits, N being a positive integer, the address decode circuit comprising a plurality of decoders each configured to receive an address segment including at least one address bit, and wherein a sum of the address bits in the plurality of address segments is N. The address decode circuit further comprises a plurality of wires connected to the plurality of decoders, each decoder configured to connect to a plurality of wires and to enable one wire for every combination of the address bits in the corresponding address segment, and an orthogonal decoder circuit comprising $2^N$ NAND gates, each NAND gate connected to one wire from each of the decoders in the plurality of decoders, wherein an output of each NAND gate corresponds to a particular combination of the N address bits.

In one example each decoder is configured to receive the same number of address bits. In another example the address decode circuit further comprises an enable line connected to at least one decoder in the plurality of decoders, the enable wire configured to provide a timing signal. In another example, the address decode circuit further comprises a plurality of latches, each latch connected to one wire in the plurality of wires and to one NAND gate in the $2^N$ NAND gates.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Technical advantages of certain embodiments include reducing power consumption and providing addressing flexibility. In some embodiments, power consumption may be reduced by approximately 50%. Other technical advantages will be readily apparent to one skilled in the art from the following figures, descriptions, and claims. Moreover, while specific advantages have been noted above, various embodiments may include all, some or none of these advantages.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
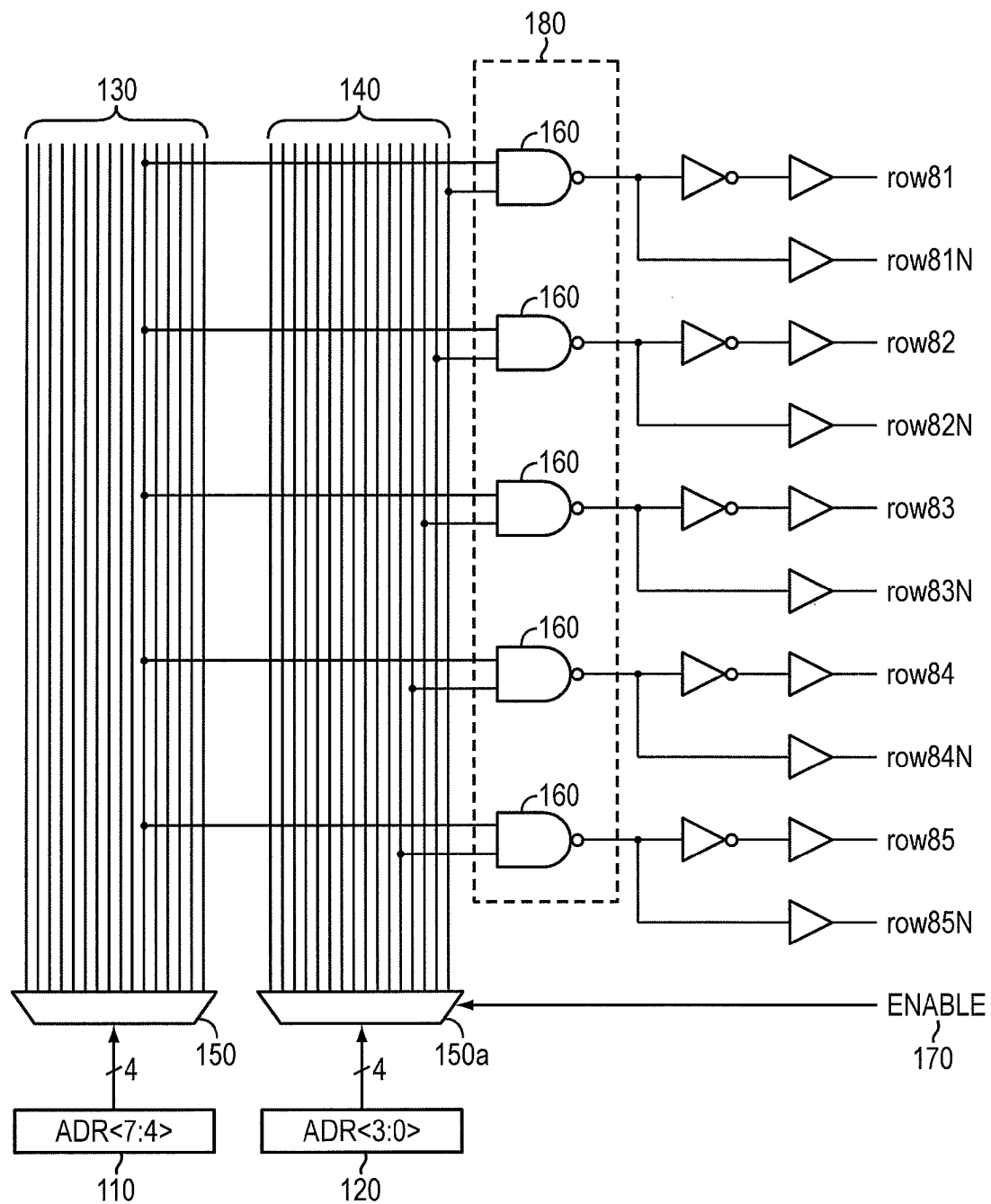
FIG. 1 is a schematic diagram of one example of a two-stage decode of an 8-bit address into two address segments, according to aspects of the invention.

Aspects and embodiments are directed to the generation of row and column address strobes that create a sequence of rows each row period, and a sequence of columns. Such a sequencing circuit is referred to as row and column address (or strobe) generation.

Although the total power consumption of row and column address generation may not be a primary power concern on Read-Out Integrated Circuits (ROICs), it is the case that power consumption of ROICs (and any electronic circuits) is becoming more important to operators of these devices. In the example of ROICs, two power consumption (also referred to as power dissipation) concerns may be present. First, many ROICs, particularly those used for infrared (IR) applications, require cooling. For example, an overall system may consume 110% of the ROIC power consumption, where it takes roughly 10× the ROIC power to keep the ROIC at 80 Kelvin. Second, in hand-held devices, battery life depends on reducing power consumption. For example, thermal weapons sights require as much battery life as possible to reduce the weight of gear (including spare batteries) that a soldier has to carry. Thus, it is desirable to reduce power consumption of any and all circuits on the ROIC. In addition to power reduction, addressing flexibility may also be desired.

Aspects and embodiments may provide an apparatus and method for row and column address generation that allows for a significant reduction in the power consumption of an electronic circuit, such as an ROIC or focal plane array (FPA). Embodiments provide for low-power algorithmic scanning of any structure with addressable content, including FPAs.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

According to one embodiment, a method of decoding a binary address dividing the address into smaller address segments and one-hot decoding each address segment. For example, an address space of N bits may be logically segmented into smaller bit groups, such as 2 bit groups, 3 bit groups, 4 bit groups, or 5 bit groups. In one example, each group of bits includes bits that are in contiguous series (e.g. bits 3 to 6). Each group of bits is decoded using a one-hot decoding scheme (e.g., 2:4, 3:8, 4:16, 5:32, etc.), as discussed further below. The outputs of the one-hot decodes are "projected" geographically over a second-stage decode region. The unique final address may be obtained from combinations of one signal from each one-hot group, as discussed further below.

According to various embodiments, an address of arbitrary size (e.g. 8 bits) may address a circuit structure of some kind, such as pixels of a Focal Plane Array (FPA). In the example of an FPA, the address may address an edge or aspect of the array (e.g. rows or columns, respectively).

Referring to FIG. 1, there is illustrated a schematic diagram of one example of a two-stage decode of an 8-bit address into two address segments. In the illustrated example, address bits <7:4>are a first address segment 110, and address bits <3:0>are a second address segment 120. Each of the address segments 110, 120 may be first-stage decoded into two sets of 16 decode lines 130 and 140, respectively, using decoders 150. In one example, each address segment 110, 120 may be fully decoded by the first stage decode into all possible combinations, for example, 2 to 4, 3 to 8, 4 to 16, 5 to 32 and so forth. The outputs of the first stage decoders 150 may have the property that at most, only one output may be enabled ("hot") at any given time, in other words, a one-hot decode. In some embodiments, the outputs of the first stage decode may be logically ANDed in a second stage decode 180 to enable an address. For example, referring to FIG. 1, the two sets of 16 decoded lines 130, 140 are projected across an array of NAND/AND gates 160. A distribution of connections (for example, metal vias on an IC) may connect all possible combinations of the first set of 16 decoded lines 130 with the second set of 16 decoded lines 140, the result being a recovery of the 256 possible decoded states of the 8-bit address.

In one embodiment, the first stage decoded signals may be projected over an addressable element, such as, for example, the row stripe (or row edge) of an FPA or the column edge of an FPA. Then, in the second stage of decode, each possible combination of first-stage decode wires may be logically ANDed to produce a final row or column address of the addressable element. In some embodiments, additional conditioning logic may be added for timing or other purposes to any set of first-stage or second-stage decode circuits, as discussed further below. For example, referring to FIG. 1, the lower first stage decode (decoder 150a in the example of FIG. 1) may also include a conditioning logic, such as an enable signal 170 that may provide timing for the final decoded address.

Still referring to FIG. 1, in some embodiments, the two-stage decode may reduce gate capacitance and gate input toggling by allowing each wire (or metal route) of either of the sets of 16 decode lines 130, 140 to couple to the input of only 16 gates, for example. As an example, in a straight decoding of an 8-bit address, every wire carrying the bits of the address would couple to 256 gates, which would result in increased gate capacitance compared to the two-stage decode method according to embodiments discussed herein. As an alternative example, address decoding for successive addressing of FPA rows or columns may be accomplished with a shift register. A "one-hot" value may be shifted into the shift register and then successively moved each clock cycle to the next row or column. A shift register consumes more power and has less flexibility for arbitrary address sequences (such as windowing functions). Finally, a shift register creates much more supply transient noise as compared to the two-stage decode method according to embodiments discussed herein. According to one embodiment, the two-stage decode method may reduce the power consumption of the address decode circuit by at least 50%.

In the example illustrated in FIG. 1, an 8-bit address is divided into two 4-bit segments. However, as discussed above, an N-bit address may be divided into two or more segments which may or may not have an equal number of bits.

Figure 2:
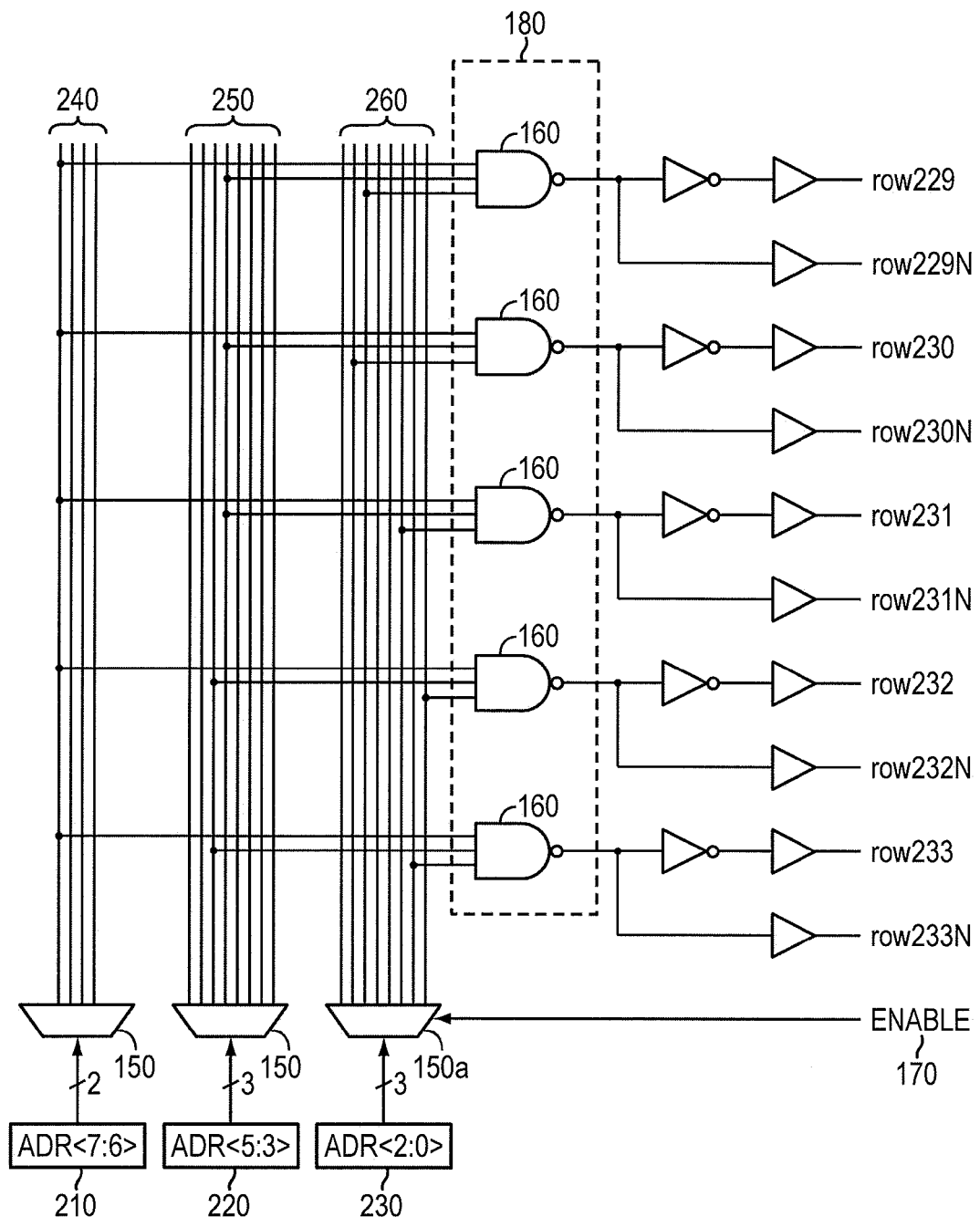
FIG. 2 is a schematic diagram of an example of a two-stage decode of an 8-bit address into three address segments, according to aspects of the invention.

FIG. 2 illustrates an example of a two-stage decode of an 8-bit address segmented into three address segments, according to one embodiment. In the illustrated example, the address is divided into three segments, namely a first address segment 210 including address bits <7:6>, a second address segment 220 including address bits <5:3>, and a third address segment 230 including address bits <2:0>. Each of the address segments 210, 220, 230 may be first-stage decoded into four lines 240, eight lines 250, and eight lines 260, respectively. In some embodiments, the lower first stage decode (first stage decoder 150a) may include a conditioning logic, such as enable signal 170 that can provide timing, as discussed above. The three sets of {4, 8, 8} decoded lines 240, 250, 260 may be projected across an array of NAND/AND gates 160, as discussed above. Similarly to the example discussed above with reference to FIG. 1, a distribution of connections (e.g. metal vias on an IC) may combine all possible combinations of the first, second, and third decoded address lines 240, 250, 260, the result being a recovery of the 256 possible decoded states of the 8-bit address.

As discussed above, in some embodiments conditioning logic which may be applied to one or more sets of first-stage or second-stage decode circuits. This conditioning logic may have a variety of functions. For example, timing may be injected (or embedded) into the low order decode lines (e.g., the 1 of 16 or the 1 of 8 low order lines) by further ANDing the low order address lines with timing strobes (such as the enable signal 170), thereby creating convenient enable timing at the leaf AND/NAND elements.

Figure 3:
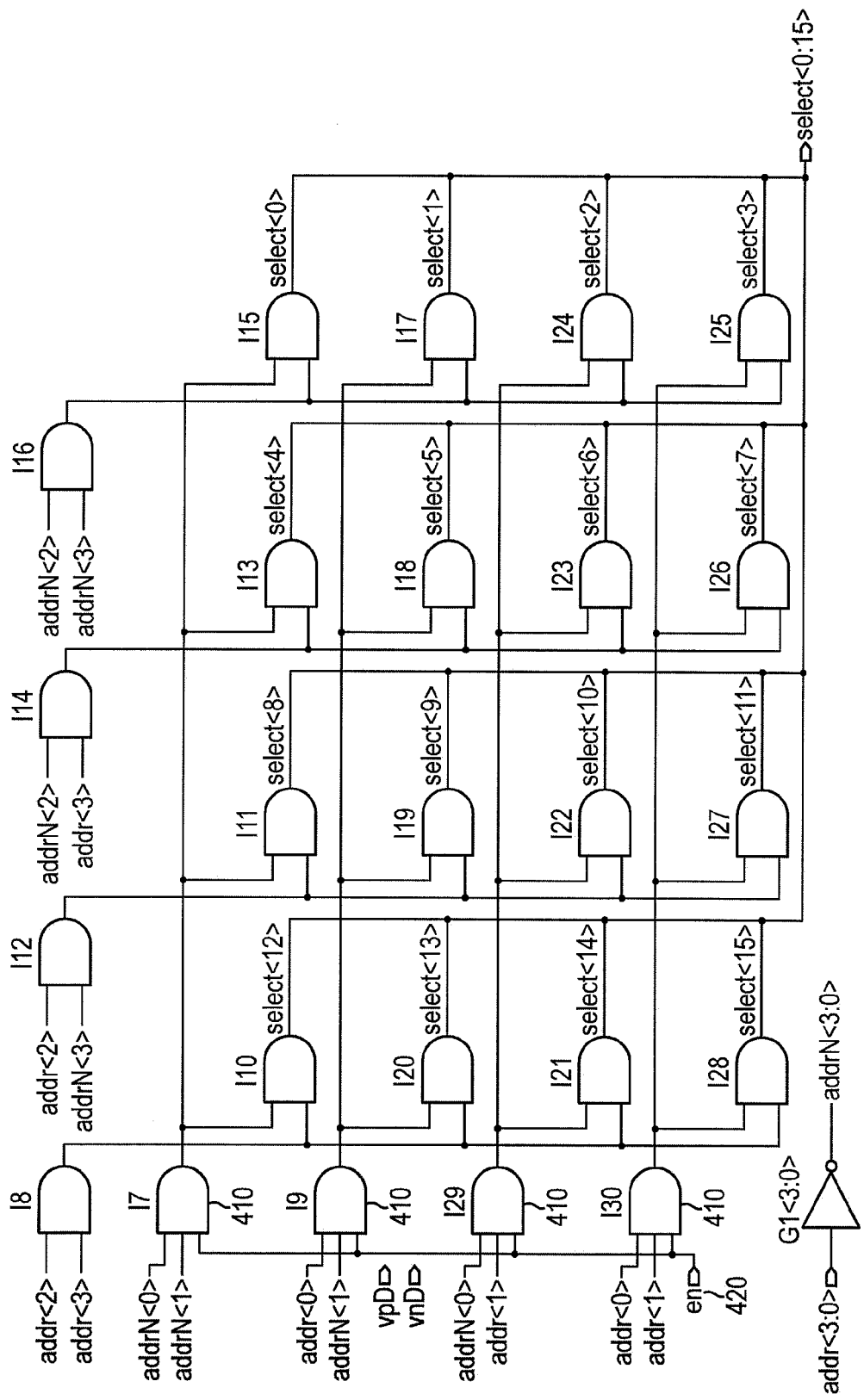
FIG. 3 is a schematic diagram of an example of a one-hot decode that includes conditioning logic, according to aspects of the invention.

FIG. 3 illustrates an example of a one-hot decode that includes conditioning logic. In particular, in FIG. 3 an example of a 4 to 16 decode circuit block is detailed. In addition, the set of four AND gates 410 have an additional input for an auxiliary enable signal 420. This auxiliary enable signal 420 may be coupled to the enable signal 170 illustrated in FIGS. 1 and 2, for example. In one embodiment, this design may significantly reduce capacitance on the enable driver and may ease implementation.

Figure 4:
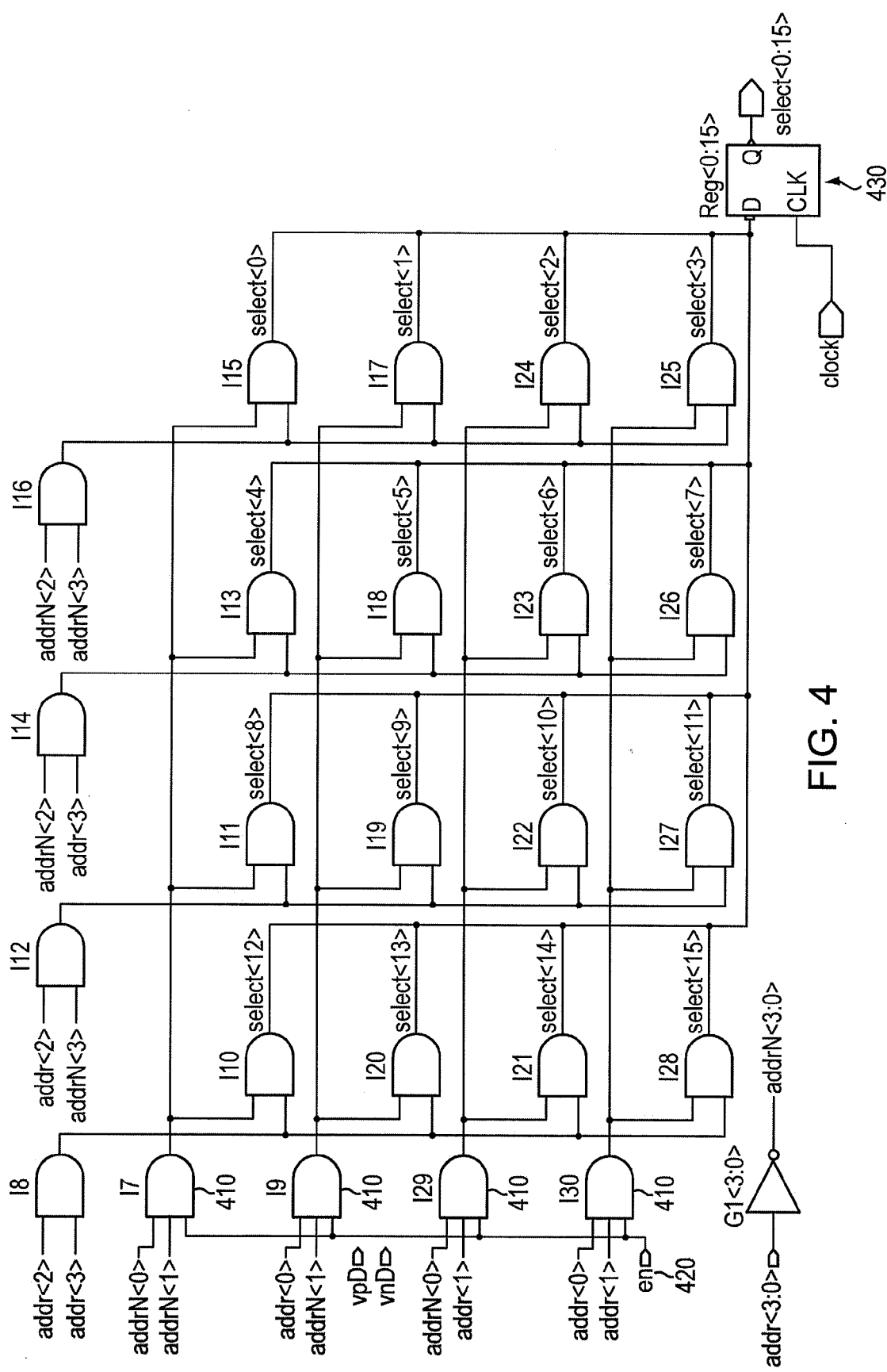
FIG. 4 is a schematic diagram of another example of a one-hot decode that includes conditioning logic and latching, according to aspects of the invention.

According to some embodiments, the outputs of the decode stages may be latched into registers to prevent glitching. For example, if the sets of first-stage decoded lines are latched, glitches may be prevented in 2nd stage decodes. In some embodiments, the timing of the first stage decodes may be staggered to prevent glitching. In some embodiments, if at least one set of the latched decoded lines is asserted on an alternate clock phase from the other lines, then the second stage decodes may be made to be substantially immune to timing variation caused by metal capacitance or gate delay effects. FIG. 4 illustrates an example of a one-hot decode circuit including a register 430 which may include latches or flipflops. The register 430 may be the same width as the number of decode lines (for example, 16 bits). Either the first stage decode or the second stage decode may be latched; however, in one embodiment, the power savings benefit of the two-stage decode may be better preserved by latching the first stage decode rather than the second stage decode.

Thus, aspects and embodiments provide methods and apparatus for decoding an address in two stages, and thereby obtaining significant power consumption savings. In addition, various embodiments may provide more robust timing closure by embedding timing signals into the decode process, as discussed above. Embodiments eliminate the need for "noisy" power-consuming shift registers to uniquely address rows and/or columns dividing the address decoding into two (or more) cascaded circuits. The address space is logically partitioned into smaller address spaces and orthogonally recombining unique combinations of decodes of these smaller address spaces to provide final unique addresses. In one example, the first cascaded circuit includes a plurality of one-hot decoders that provide one decode for each address segment. The second cascaded circuit may include a plurality of AND gates that orthogonally recombine unique combinations of each one-hot decode to produce the unique addresses, as discussed above. Embodiments of this architecture are efficient in terms of power consumption and chip area.

Having described above several aspects of at least one embodiment, it is to be appreciated various alterations, modifications, and improvements will readily occur to those skilled in the art. For example, numerous variations of the logical gates used in the second decode stage may be implemented. For example, NAND gates may be replaced with AND gates and inverters. Other configurations that achieve a logical combination of the one-hot decodes from the first decode stage may also be implemented. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An address decode circuit comprising:
a first decoder circuit configured to partition an N-bit address of an addressable element into at least three address segments, each address segment including fewer than N bits, and N being a positive integer, the first decoder circuit including a corresponding plurality of one-hot decoders and a corresponding plurality of sets of decode lines, each set of decode lines coupled to a respective one of the plurality of one-hot decoders, wherein the first decoder circuit is configured to first-stage decode the at least three address segments into the plurality of sets of decode lines using the plurality of one-hot decoders, each one-hot decoder configured to receive and decode one of the at least three address segments, to provide a plurality of first-stage decoded address outputs from the N-bit address, wherein only one of the plurality of first-stage decoded address outputs is enabled at any given time; and a second orthogonal decoder circuit coupled to the plurality of sets of decode lines and configured to receive the plurality of first-stage decoded address outputs and to produce $2^N$ unique decoded addresses at $2^N$ address outputs from unique combinations of the plurality of first-stage decoded address outputs, each one of the $2^N$ address outputs corresponding to one unique decoded address within the addressable element derived from the N-bit address.

2. The address decode circuit of claim 1, wherein the second orthogonal decoder circuit includes at least one AND gate configured to orthogonally recombine the unique combinations of the plurality of first-stage decoded address outputs to produce the $2^N$ unique decoded addresses at the address outputs.

3. The address decode circuit of claim 1, wherein the second orthogonal decoder circuit includes at least one NAND gate configured to orthogonally recombine the unique combinations of the plurality of first-stage decoded address outputs to produce the $2^N$ unique decoded addresses.

4. The address decode circuit of claim 1, wherein each address segment includes the same number of address bits.

5. The address decode circuit of claim 1, further comprising embedded conditioning logic coupled to the first decoder circuit.

6. The address decode circuit of claim 5, wherein the embedded conditioning logic includes an embedded timing signal.

7. The address decode circuit of claim 1, wherein the addressable element is a row stripe, row edge, or column edge of a pixel array.

8. A method of decoding an N-bit binary address of an addressable element, N being a positive integer, the method comprising:
    partitioning the N-bit address into at least three address segments, each address segment including fewer than N bits;
    decoding each of the at least three address segments using a one-hot decoding process to provide corresponding a plurality of groups of first-stage decodes, each group of first stage decodes corresponding to one of the plurality of address segments, wherein only one first-stage decode in each group of first-stage decodes in enabled at any given time;
    projecting the plurality of groups of first-stage decodes over a second-stage decode region corresponding to the addressable element; and
    producing $2^N$ unique decoded addresses at $2^N$ address outputs, each one of the $2^N$ address outputs corresponding to one unique decoded address derived from the N-bit address, from exhaustive combinations of one first-stage decode from each of the plurality of groups of first-stage decodes.

9. The method of claim 8, further comprising coupling an embedded timing signal into at least one of the three address segments.

10. The method of claim 8, wherein the addressable element is a row stripe, row edge, or column edge of a pixel array, and wherein producing the $2^N$ unique decoded addresses includes producing final row or column addresses of the addressable element.

11. An address decode circuit configured to decode an address of N address bits, N being a positive integer, the address decode circuit comprising:
    a plurality of one-hot decoders each configured to receive and decode one of at least three address segments, each address segment including at least one address bit and wherein a sum of the address bits in the at least three address segments is N;
    a corresponding plurality of sets of wires connected to the plurality of one-hot decoders, each one-hot decoder connected to one set of wires, and each set of wires including at least two wires, each one-hot decoder configured to enable one wire in the respective set of wires for every combination of the address bits in the corresponding address segment; and
    an orthogonal decoder circuit comprising $2^N$ NAND gates, each NAND gate connected to one wire from each set of wires for each of the decoders in the plurality of one-hot decoders, wherein an output of each NAND gate corresponds to a particular combination of the N address bits describing one unique decoded address of an addressable element derived from the address of N address bits.

12. The address decode circuit of claim 11, wherein each address segment includes the same number of address bits.

13. The address decode circuit of claim 11, further comprising an enable line connected to at least one decoder in the plurality of decoders, the enable line configured to provide a timing signal.

14. The address decode circuit of claim 11, further comprising a plurality of latches, each latch connected to one wire in the plurality of sets of wires and to one NAND gate in the $2^N$ NAND gates.

* * * * *